United States Patent
Ramesh et al.

(10) Patent No.: US 11,408,919 B2
(45) Date of Patent: Aug. 9, 2022

(54) DEVICE SIGNAL SEPARATION FOR FULL DUPLEX SERIAL COMMUNICATION LINK

(71) Applicant: Tektronix, Inc., Beaverton, OR (US)

(72) Inventors: P E Ramesh, Bengaluru (IN); Tsuyoshi Miyazaki, Kawaguchi (JP)

(73) Assignee: Tektronix, Inc., Beaverton, OR (US)

( * ) Notice: Subject to any disclaimer, the term of this patent is extended or adjusted under 35 U.S.C. 154(b) by 72 days.

(21) Appl. No.: 16/721,677

(22) Filed: Dec. 19, 2019

(65) Prior Publication Data
US 2020/0209290 A1  Jul. 2, 2020

Related U.S. Application Data

(60) Provisional application No. 62/807,723, filed on Feb. 19, 2019.

(30) Foreign Application Priority Data

Dec. 31, 2018  (IN) .............................. 201821049938

(51) Int. Cl.
| | | |
|---|---|---|
| *H04L 5/14* | (2006.01) | |
| *G01R 19/25* | (2006.01) | |
| *H01P 3/00* | (2006.01) | |

(52) U.S. Cl.
CPC .......... *G01R 19/2509* (2013.01); *H01P 3/003* (2013.01); *H04L 5/1423* (2013.01)

(58) Field of Classification Search
CPC ..... G01R 19/2509; G01R 19/25; H01P 3/003; H04L 5/1423; H04L 43/12; H04L 43/50; H04L 43/0847; H04L 5/14; H04L 43/08
See application file for complete search history.

(56) References Cited

U.S. PATENT DOCUMENTS

| | | |
|---|---|---|
| 5,425,052 A | 6/1995 | Webster et al. |
| 5,500,879 A | 3/1996 | Webster et al. |
| (Continued) | | |

FOREIGN PATENT DOCUMENTS

| | | | |
|---|---|---|---|
| WO | 2008046124 | 4/2008 | |
| WO | WO-2016202396 A1 * | 12/2016 | ............... H04B 3/46 |
| (Continued) | | | |

OTHER PUBLICATIONS electronicsforu.com, "Non-Intrusive PAM3 Automotive Ethernet Protocol Decoder in Beta Version," Jul. 4, 2019, available at https://test.electronicsforu.com/non-intrusive-pam3-automotive-ethernet-protocol-decoder-in-beta-version/.

(Continued)

*Primary Examiner* — Jay P Patel
(74) *Attorney, Agent, or Firm* — Miller Nash LLP; Andrew J. Harrington

(57) ABSTRACT

A test and measurement instrument for extracting waveforms from a differential transmission line without disrupting the differential transmission line. The test and measurement instrument includes a first input configured to receive a voltage waveform from a voltage probe electrically coupled to the first and second lines of the differential transmission line that electrically connect a first device and a second device, a second input configured to receive a current waveform from a current probe coupled to the differential transmission line, and one or more processors configured to receive the voltage waveform and the current waveform and determine a voltage of the first device and a voltage of the second device based on the voltage waveform and the current waveform.

24 Claims, 6 Drawing Sheets

(56) References Cited

U.S. PATENT DOCUMENTS

| | | | |
|---|---|---|---|
| 5,514,978 A | 7/1996 | Koegl et al. | |
| 9,071,293 B1* | 6/2015 | Venditti | H04B 1/0475 |
| 9,432,298 B1* | 8/2016 | Smith | H04L 49/9057 |
| 9,667,058 B2* | 5/2017 | Johannesson | H02H 7/265 |
| 2004/0124996 A1* | 7/2004 | Andersen | G08C 19/16 |
| | | | 340/870.38 |
| 2006/0076969 A1* | 4/2006 | Turvey | H03K 17/04113 |
| | | | 327/432 |
| 2006/0082418 A1* | 4/2006 | Wood | G06F 1/10 |
| | | | 331/57 |
| 2008/0304578 A1* | 12/2008 | Matsubara | H04B 3/30 |
| | | | 375/257 |
| 2008/0310521 A1* | 12/2008 | Otsuka | H04L 25/028 |
| | | | 375/257 |
| 2009/0003464 A1* | 1/2009 | Matsubara | H04L 25/0272 |
| | | | 375/257 |
| 2009/0122199 A1* | 5/2009 | Hamada | H04L 25/085 |
| | | | 348/721 |
| 2011/0156664 A1 | 6/2011 | Horihata | |
| 2011/0227641 A1* | 9/2011 | Weiss | H04L 25/0272 |
| | | | 327/595 |
| 2014/0225626 A1* | 8/2014 | Venkatasubramanian | |
| | | | G01R 19/2513 |
| | | | 324/537 |
| 2015/0035681 A1* | 2/2015 | Bryson, Jr | H02J 13/0006 |
| | | | 340/870.02 |
| 2015/0222236 A1* | 8/2015 | Takemoto | H03F 3/08 |
| | | | 250/214 A |
| 2015/0311714 A1* | 10/2015 | Dolezilek | H02J 13/00034 |
| | | | 700/286 |
| 2017/0108541 A1* | 4/2017 | Oda | G01R 19/16547 |
| 2017/0117701 A1* | 4/2017 | Johannesson | H02H 7/265 |
| 2017/0279376 A1* | 9/2017 | Siri | H03L 7/099 |
| 2018/0189129 A1* | 7/2018 | Jansen | H02H 3/20 |
| 2019/0081574 A1* | 3/2019 | Bergquist | H02M 1/08 |
| 2019/0158143 A1* | 5/2019 | Honda | H03K 19/0185 |
| 2019/0158144 A1* | 5/2019 | Honda | H04L 25/02 |
| 2020/0059264 A1* | 2/2020 | Yamashita | B60R 16/023 |

FOREIGN PATENT DOCUMENTS

| | | | | |
|---|---|---|---|---|
| WO | WO-2018020782 A1 * | 2/2018 | | H03K 19/0185 |
| WO | WO-2018020783 A1 * | 2/2018 | | H04B 3/42 |

OTHER PUBLICATIONS

European Patent Office, Extended European Search Report and Written Opinion for European Application No. 19220203.4, dated Apr. 8, 2020, 8 pages, Munich, Germany.

* cited by examiner

DEVICE SIGNAL SEPARATION FOR FULL DUPLEX SERIAL COMMUNICATION LINK

PRIORITY

This disclosure claims priority from Indian Provisional patent application Serial No. 201821049938 filed Dec. 31, 2018 and titled DUPLEX SIGNAL SEPARATION IN AUTOMOTIVE ETHERNET, and claims benefit of U.S. Provisional Application No. 62/807,723 filed Feb. 19, 2019, and titled TX AND RX SIGNAL SEPARATION FOR FULL DUPLEX SERIAL COMMUNICATION SIGNAL.

FIELD OF THE INVENTION

This disclosure is directed to systems and methods related to test and measurement systems, and in particular, to methods and devices for measuring a full duplex serial communication signal without disrupting the communication link.

BACKGROUND

Full duplex communication links between two devices are employed in a wide variety of communication systems. Although signals sent across the communication links are analog, the waveform level conveys the digital logic level information. When communicating using a full duplex communication link, such as a 100 Base T1, 1000 Base T1, etc. each device exchanges information with the other device using training patterns which can allow link parameters to be adjusted by the devices to receive information without error.

In operation, it can be important to test the signal levels on the line, such as to ensure a low bit error rate and that no redundancy is involved because it is important that no information is misinterpreted and lost.

If only one device is sending information, an oscilloscope can monitor the signals and information may be decoded and physical layer signal integrity can be analyzed. However, in full duplex communication links, both devices are sending information. The waveforms sent by each device are added, and an oscilloscope is not able to make any sense of the information from the acquired signal without utilizing a signal separation device, which can interject noise into the signals.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
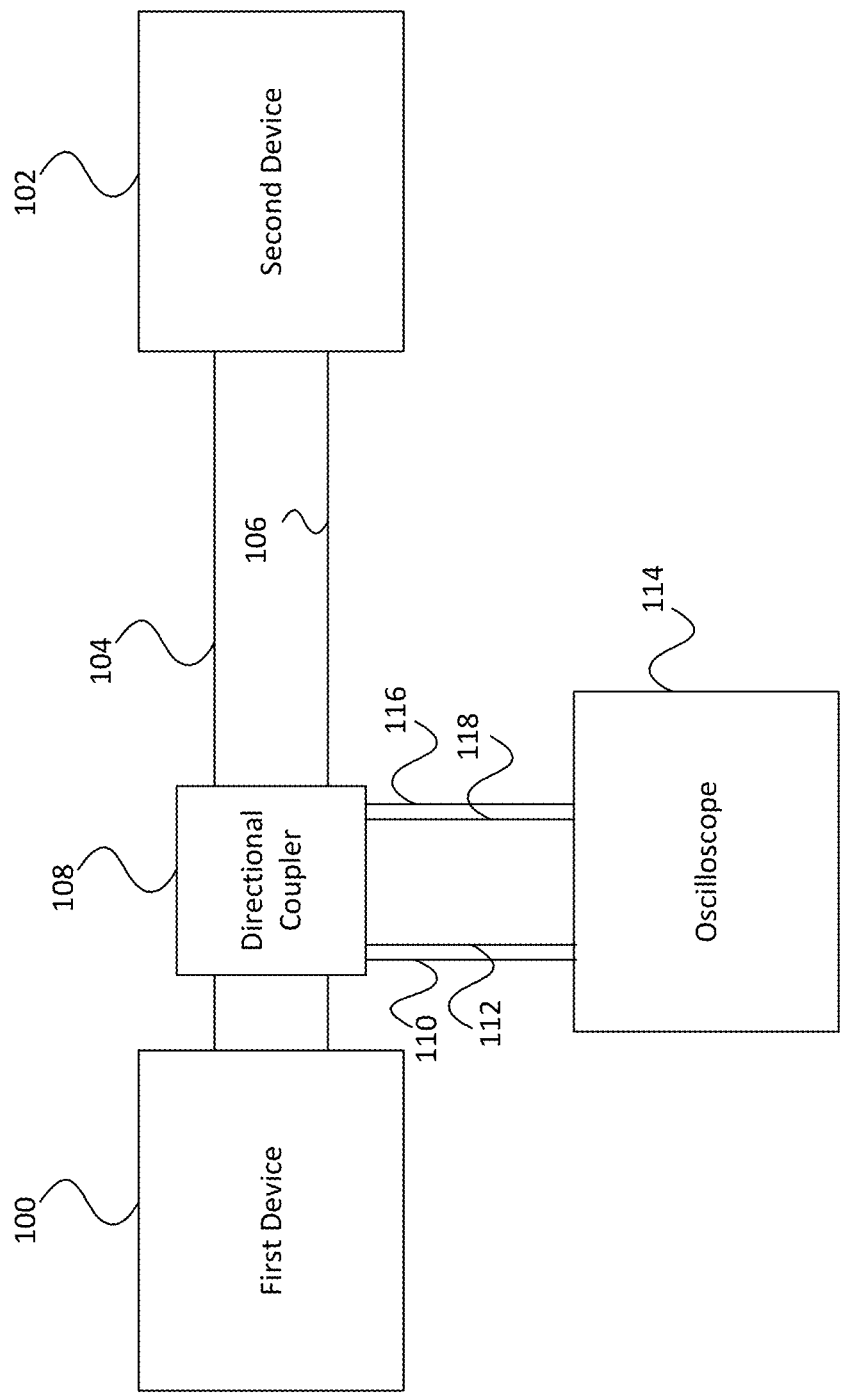
FIG. 1 is an example of a conventional test and measurement system for measuring a signal from a device connected to another device via a communication link.

Embodiments of the disclosure allow for a duplex signal between two devices to be non-invasively separated into simple signals. FIG. 1 illustrates a conventional system for separating the duplex signal between the two devices 100 and 102. A differential transmission line includes two lines 104 and 106 to send and receive signals between the devices 100 and 102.

In the conventional system, a directional coupler 108 is inserted into the transmission line between the two devices 100 and 102, as well as by interrupting the transmission lines 104 and 106. The directional coupler 108 can be physically large and there are times when there is not enough space provided between the first device 100 and the second device 102 to use the directional coupler 108.

The directional coupler 108 can output transmitter signals 110 and 112 to a test and measurement instrument 114, and receiver signals 116 and 118 to the test and measurement instrument 114 for further analysis. However, the signals produced by the directional coupler 108 are approximately 12 to 20 decibels attenuated, depending on the directional coupler, which can make it difficult to measure the signals accurately with a good signal to noise radio (SNR). Further, inserting the directional coupler 108 on the transmission line 104 and 106 can introduce some undesirable effects to the communication signals. And if there are any characteristic differences, such as length, parasitic reactance, etc., between the transmission lines 104 and 108 probing points (that is, the location of the directional coupler 108) from the transmission side and from the receiver side, the receiver signal may not be separated accurately even if the transmission signal is separated properly, or vice versa.

As will be discussed in more detail below, embodiments of the disclosure allow for separating the duplex signal without the use of a directional coupler. Rather, as will be described in detail, voltage and current probes can be used and the test and measurement instrument can separate the signals based on the information received through the probes.

Figure 2:
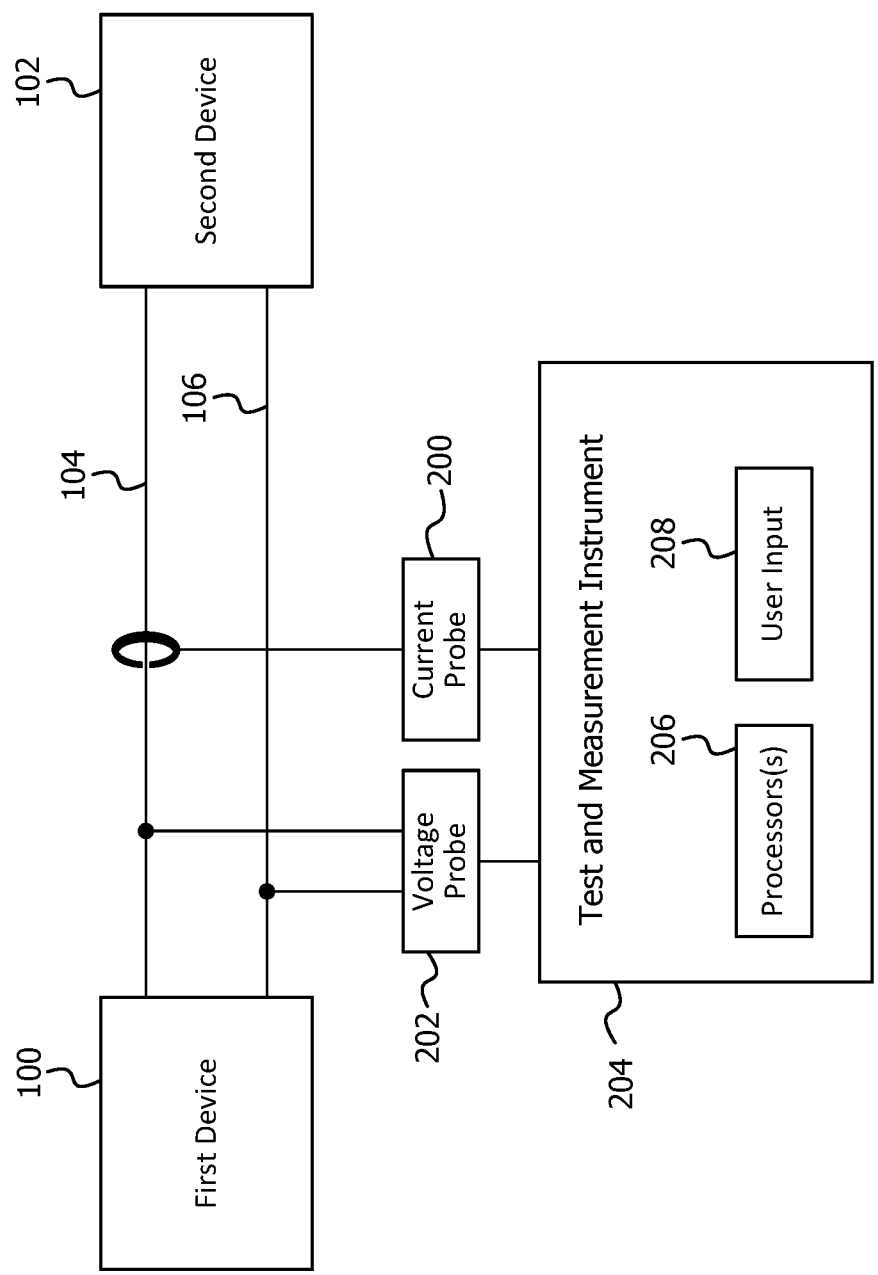
FIG. 2 is an example of a test and measurement system for extracting signals from the devices according to some embodiments of the disclosure.

FIG. 2 illustrates an example test and measurement system according to some embodiments of the disclosure. Similar to FIG. 1, the test and measurement system includes a first device 100 and a second device 102. The first device 100 and the second device 102 communicate on a common differential transmission line for communicating a full duplex differential signal. The common differential transmission line may be, for example, a full duplex serial communication link such as, but not limited to, 100 Base T1, 1000 Base T1, etc. This type of line is often used, for example, in automotive Ethernet, which uses full-duplex signaling over a single twisted pair of wires, which may operate at a multi-level modulation scheme, such as two or more levels.

The common differential transmission line includes a first line 104 and a second line 106. Each of the voltage and current waveforms on the transmission line appear as superimposed waveforms. That is, a signal is sent concurrent from the first device and the second device. Looking at it from the view point of the first device 100, the output of the first device 100 is a transmission signal and the output from the second device 102 is the receiver signal. For ease of discussion, the output of the first device 100 will be characterized as the transmission signal, or Tx signal, and the output of the second device 102 will be characterized as the receiver signal, or Rx signal. However, as will be understood by one skilled in the art, both the first device 100 and the second device 102 are concurrently sending and receiving signals on the differential signal lines.

In the system of FIG. 2, a differential voltage probe 202 is connected to differential signal lines 104 and 106. A current probe 200 is coupled to one of the differential signal lines. In FIG. 2, the current probe 200 is coupled to transmission line 104, but as will be understood by one skilled in the art, the current probe 200 could be coupled to the transmission line 106 instead.

The output of the current probe 200 and the voltage probe 202 are sent to the test and measurement instrument 204. In a conventional oscilloscope, the signals obtained from probing the transmission lines 104 and 106 are displayed as superimposed signals. However, embodiments of the disclosure include a test and measurement instrument 204 that has one or more processors 206 and/or other hardware that can separate the transmission and receiver signals.

For ease of discussion, the signal from the first device 100 will be referred to as Tx and the signal from the second device 102 will be referred to as Rx. Each of the signals Tx and Rx may have a high level of 1V and a low level of −1V. However, the levels of the Tx and Rx signals is based on the number of modulation levels. The differential transmission lines can have a differential termination impedance, referred to as Z. This value may be set based on the actual differential termination impedance of the differential transmission line used. For examples below, Z will be set to 100 Ohms in this example. However, as will be understood by one skilled in the art, this value can be set by a user in the test and measurement instrument 204 based on the actual differential termination impedance of the differential termination line used.

When both the Tx and Rx signals are high, then the measured voltage by the voltage probe 202 at that point will be approximately 2V. At that moment, the current of the Tx signal flows from the first device 100 to the second device 102, while the current of the Rx signal flows from the second device 102 to the first device 100. Since the direction of the Tx and Rx currents are the reverse of each other, the superimposed current measured by the current probe 200 is zero Ampere.

When both the Tx and Rx signals are low, the voltage probe 202 will read a voltage of −2V, meanwhile the current is still 0 Ampere since the currents are still reverse of each other. However, when the Tx signal is high and the Rx signal is low, the superimposed voltage measured by the voltage probe 202 is 0V, and the superimposed current is 20 mA in this example, which is illustrated in equation (1):

$$(1V/100\Omega)-(-1V/100\Omega)=20 \text{ mA} \quad (1)$$

When the Tx signal is low and the Rx signal is high, the superimposed voltage measured by the voltage probe 202 is again 0V, and the superimposed current is −20 mA. For purposes of discussion, current flowing from the first device 100 to the second device 102 is defined as a positive current.

The probed voltage waveform by the voltage probe 202 is referred to as superimposed voltage waveform $V_{TxRx}$ and the current waveform probed by the current probe 200 will be referred to as superimposed current waveform $I_{TxRx}$, and the differential termination impedance will be referred to as Z. The Tx signal voltage will be referred to as $V_{Tx}$ and the current will be referred to as $I_{Tx}$. The Rx signal voltage will be referred to as $V_{Rx}$ and the current will be referred to as $I_{Rx}$.

To extract the Tx voltage signal from the superimposed voltage waveform $V_{TxRx}$, the Rx voltage waveform $V_{Rx}$ has to be subtracted from the superimposed voltage waveform $V_{TxRx}$. However, the Rx voltage waveform $V_{Rx}$ cannot be obtained directly by probing because, as mentioned above, the Tx and Rx signals are superimposed on the transmission lines 104 and 106.

However, a multiplication of the probed current $I_{TxRx}$ and the impedance Z is equal to $V_{Tx}$ less $V_{Rx}$. Therefore, adding the superimposed current waveform $I_{TxRx}$ multiplied by Z to the superimposed voltage waveform $V_{TxRx}$ results in:

$$V_{TxRx}+I_{TxRx}*Z=(V_{Tx}+V_{Rx})(V_{Tx}-V_{Rx})=2V_{Tx} \quad (2)$$

Then, $V_{Tx}$ is equal to:

$$V_{Tx}=(V_{TxRx}+I_{TxRx}*Z)\div 2 \quad (3)$$

For $V_{Rx}$, subtracting the superimposed current waveform $I_{TxRx}$ multiplied by Z from the superimposed voltage waveform $V_{TxRx}$, results in:

$$V_{TxRx}-I_{TxRx}*Z=(V_{Tx}+V_{Rx})(V_{Tx}-V_{Rx})=2V_{Rx} \quad (4)$$

Then, $V_{Rx}$ is equal to:

$$V_{Rx}=(V_{TxRx}-I_{TxRx}*Z)\div 2 \quad (5)$$

Using these equations, in one embodiment of the disclosure, the one or more processors 206 of the test and measurement instrument 204 can receive the superimposed voltage waveform $V_{TxRx}$ from the voltage probe 202 at a first input and can receive the superimposed current waveform $I_{TxRx}$ from the current probe 202 at a second input. Using the differential termination impedance Z, which may be set through a user input 208 or stored in memory, the one or more processors 206 can separate the Tx signal voltage waveform $V_{Tx}$ and the Rx signal voltage waveform $V_{Rx}$ from the superimposed voltage waveform $V_{TxRx}$.

When there is a difference between the distance along the transmission line from the first device 100 to the probing point and from the second device 102 to the probing point, e.g., the probing point may be closer to the first device 100, and if there is parasitic reactance over the transmission lines 104 and 106 from the second device 102 and the probing point (such as due to connectors and the longer transmission line), there may be a phase difference between the voltage waveform and the current waveform from the second device 102, even if there is no phase difference between the voltage waveform and the current waveform from the first device 100.

For example, parasitic inductance of connectors can cause current phase delays. As a result of this, the Rx voltage waveform $V_{Rx}$ determined from equation (5) may not be accurate. In such a situation, the one or more processors 206 can use digital signal processing to correct the phase difference due to parasitic reactance, and the phase-corrected Rx waveform may be used for the above waveform arithmetic processing, which will allow for extracting the Rx signal more accurately.

That is, using the embodiment described above, the Tx signal may be extracted using the measured superimposed current waveform $I_{TxRx}$ and superimposed voltage waveform $V_{TxRx}$, while the Rx signal is extracted using the measured superimposed voltage waveform $V_{TxRx}$ and a delay-corrected current waveform $I_{TxRx}$.

Figure 3:
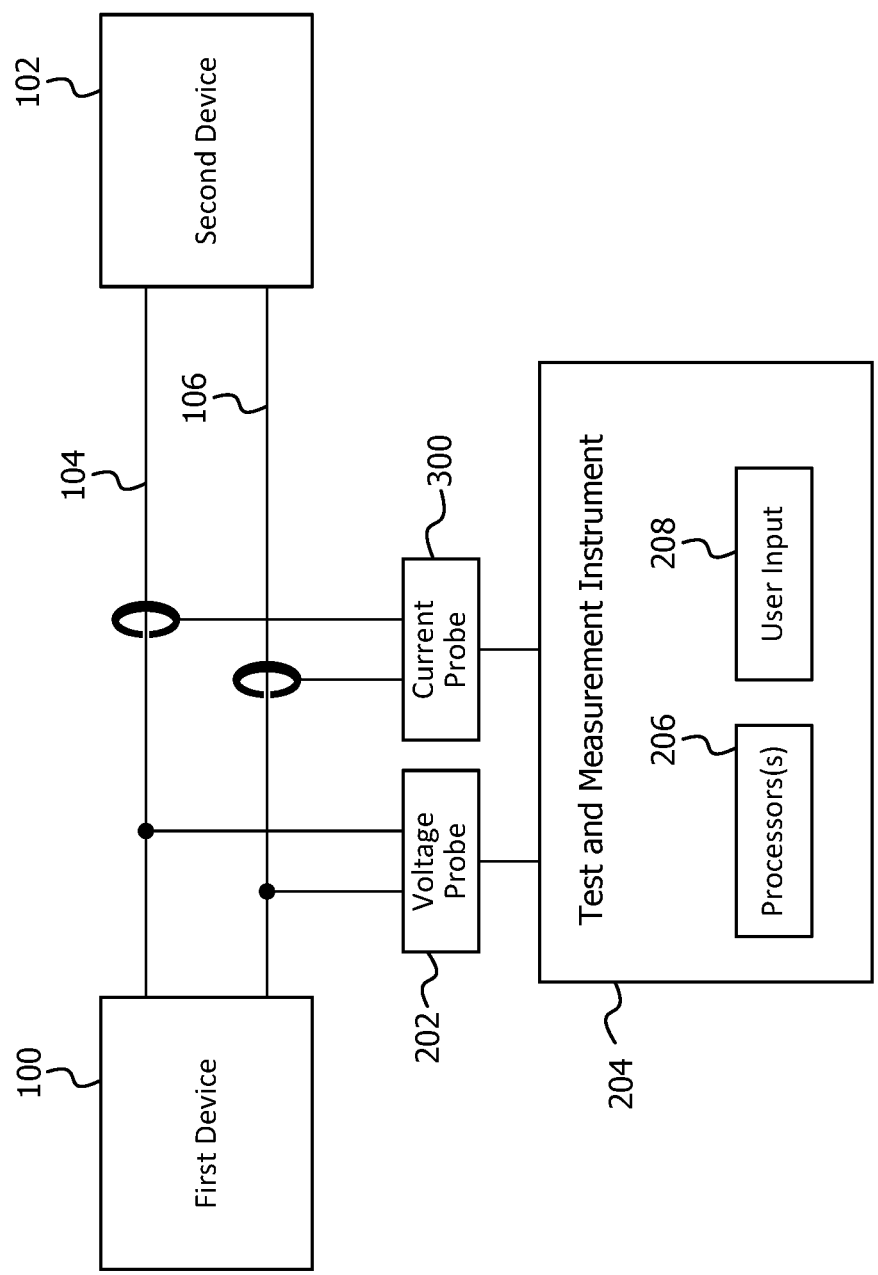
FIG. 3 is another example of a test and measurement system for extracting signals from the devices according to some embodiments of the disclosure.

In some embodiments, as illustrated in FIG. 3, a current probe 300 may be coupled to both transmission lines 104 and 106 to determine the current on both lines 104 and 106. The differential current waveform obtained by current probe 300 can eliminate common-mode current noise. In some embodiments, the current probe 300 may be two current probes, with one probe coupled to line 104 and the other current probe coupled to the line 106.

If the current probe 300 is coupled to both lines 104 and 106, the measured superimposed current $I_{TxRx}$ will have double the amplitude. To account for this, equations (3) and (5) above can be modified as follows:

$$V_{Tx} = (V_{TxRx} + I_{TxRx} * Z \div 2) \div 2 \qquad (6)$$

$$V_{Rx} = (V_{TxRx} - I_{TxRx} * Z \div 2) \div 2 \qquad (7)$$

Figure 4:
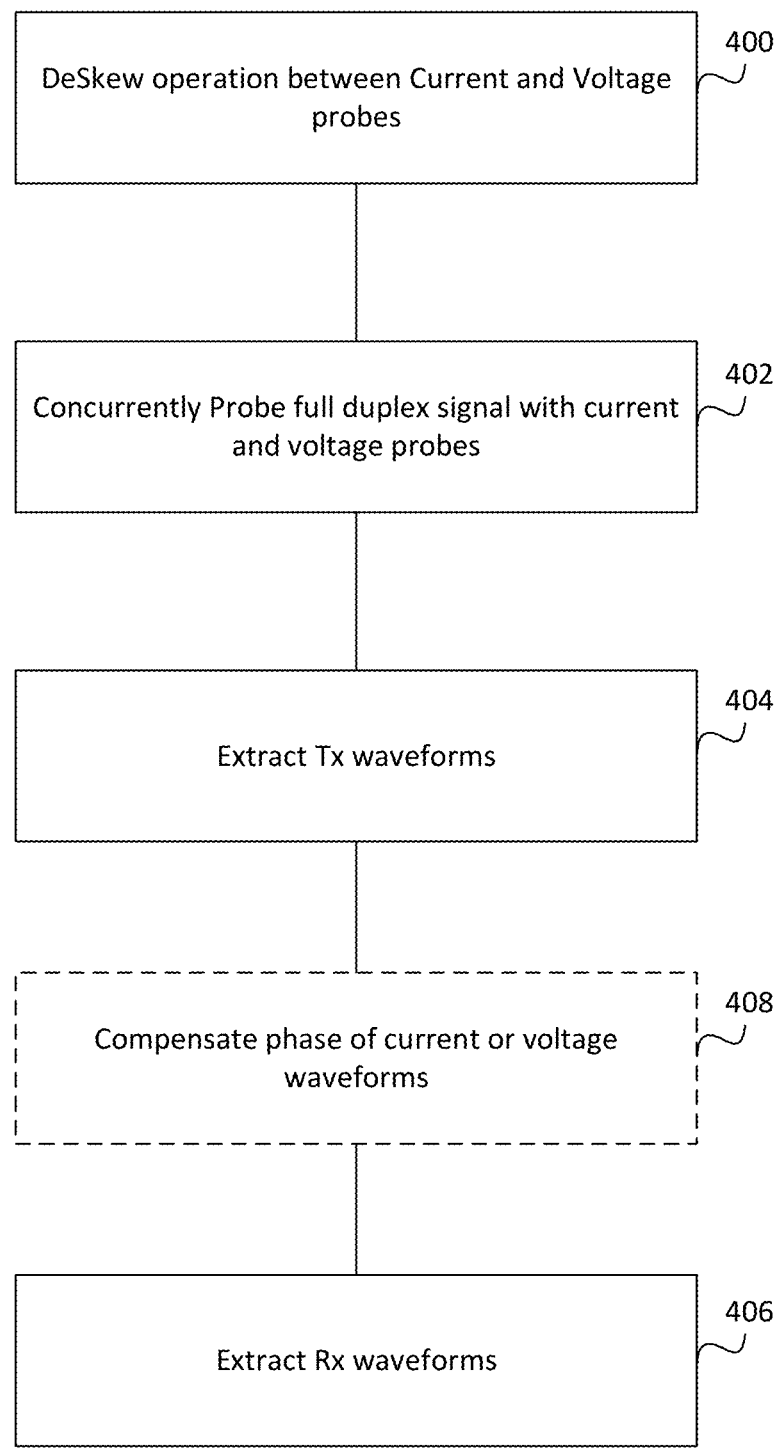
FIG. 4 is an example operation for extracting signals from the devices without disrupting the communication link according to some embodiments of the disclosure.

FIG. 4 illustrates an example operation for separating the superimposed waveform $V_{TxRx}$ according to some embodiments. Initially, in operation 400, a deskew operation can be performed between the current probes and the voltage probes to allow for phase calibration between current and voltage measurement systems of the test and measurement instrument 204.

Once the current and voltage probes have been calibrated, then in operation 402, the full duplex communication signal is concurrently probed with current and voltage probes to acquire the superimposed current waveform $I_{TxRx}$ and the superimposed voltage waveform $V_{TxRx}$ at the test and measurement instrument 204.

In some embodiments, an adaptive filter is used to match the voltage probe and the current probe. This can allow for correct signal separation, and the adaptive filter may be adapted based on the model of the currently used voltage probe and current probe.

The test and measurement instrument 204 then, in operation 404, extracts the Tx waveform based on the superimposed current waveform $I_{TxRx}$ and the superimposed voltage waveform $V_{TxRx}$, as discussed above. For example, the test and measurement instrument 204 may use one of equations (3) or (6) discussed above to determine the Tx waveforms. The test and measurement instrument 204 may do this by utilizing the one or more processors 206 or using other hardware located in the test and measurement instrument 204.

In operation 406, the test and measurement instrument 204, through the one or more processors 206 and/or other hardware, can then extract the Rx waveforms using one of equations (4) or (7) discussed above.

The extracted Tx and Rx waveforms may be saved in a memory, displayed to a user on a display, or may be further analyzed, such as for signal integrity and/or decode analysis.

In some embodiments, an optional operation 408 may be performed before extracting the Rx waveform in operation 406. In operation 408, the test and measurement instrument 204, through either the one or more processors 206 and/or other hardware, may compensate the phase of the superimposed current waveform $I_{TxRx}$, as discussed above. That is, the phase of the superimposed current waveform $I_{TxRx}$ can be compensated based on the parasitic reactance over the transmission line from the second device 102 to the probing point. In alternative embodiments, rather than compensating the superimposed current waveform $I_{TxRx}$, the superimposed voltage waveform $V_{TxRx}$ may instead be compensated based on the parasitic reactance of the transmission line.

Further, the extraction of the Tx and the Rx waveforms does not need to be performed linearly, as shown in FIG. 4 for ease of discussion. Rather, the Tx and Rx waveforms may be extracted in parallel for faster processing time, or the Rx waveform may be extracted prior to the Tx waveform.

Figure 5:
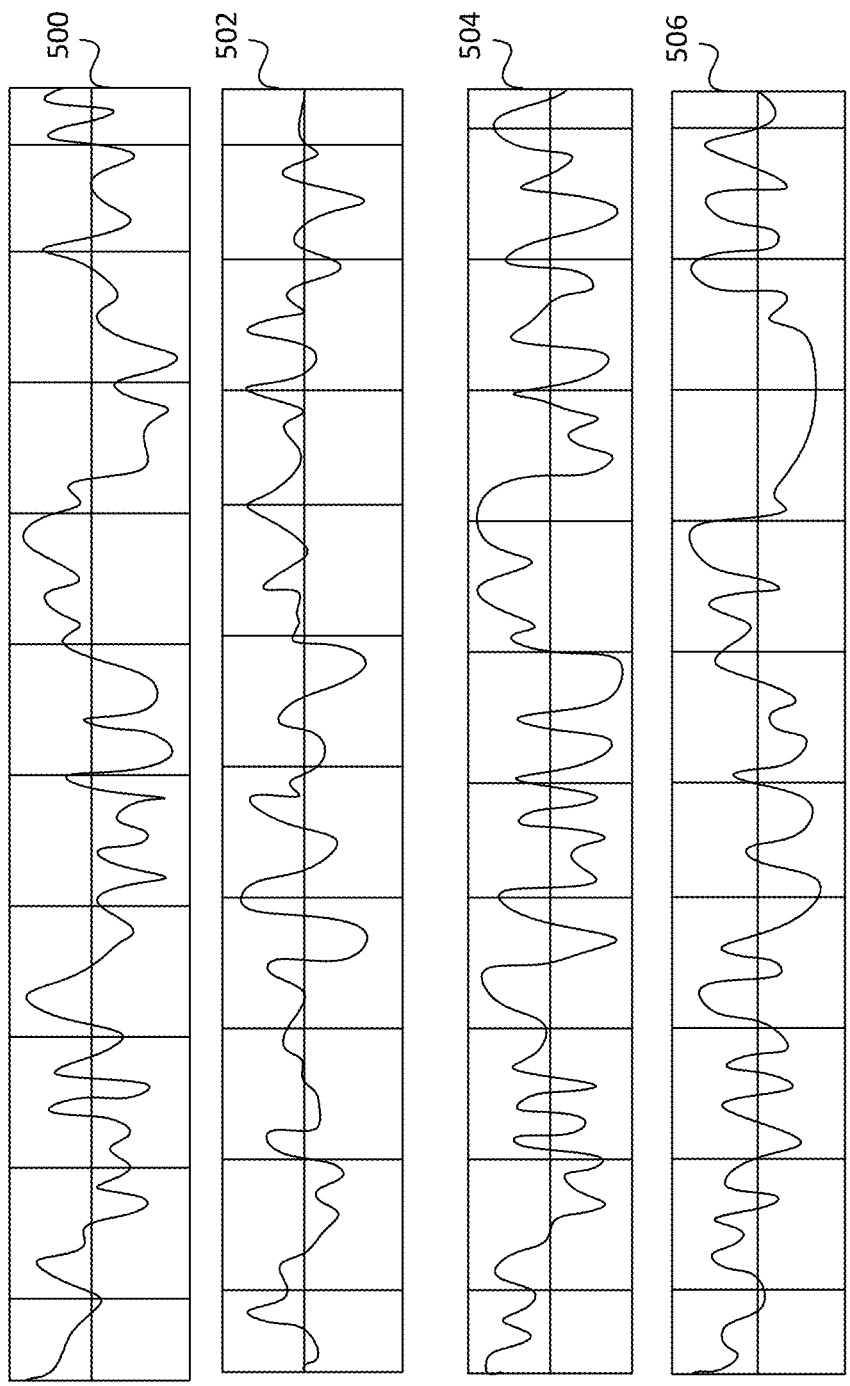
FIG. 5 includes example plots for extracted signals from the communication link between two devices.

FIG. 5 illustrates a number of plots with different waveforms. Plot 500 illustrates a superimposed voltage waveform $V_{TxRx}$ and plot 502 illustrates a superimposed current waveform $I_{TxRx}$. Using the embodiments discussed above, plot 504 illustrates an example of an extracted $V_{Tx}$ waveform from the superimposed voltage waveform of plot 500. And plot 506 illustrates an example of an extracted $V_{Rx}$ waveform from the superimposed voltage waveform of plot 500. These waveforms in plots 504 and 506 may then be used for further processing, such as generating eye diagrams.

Figure 6:
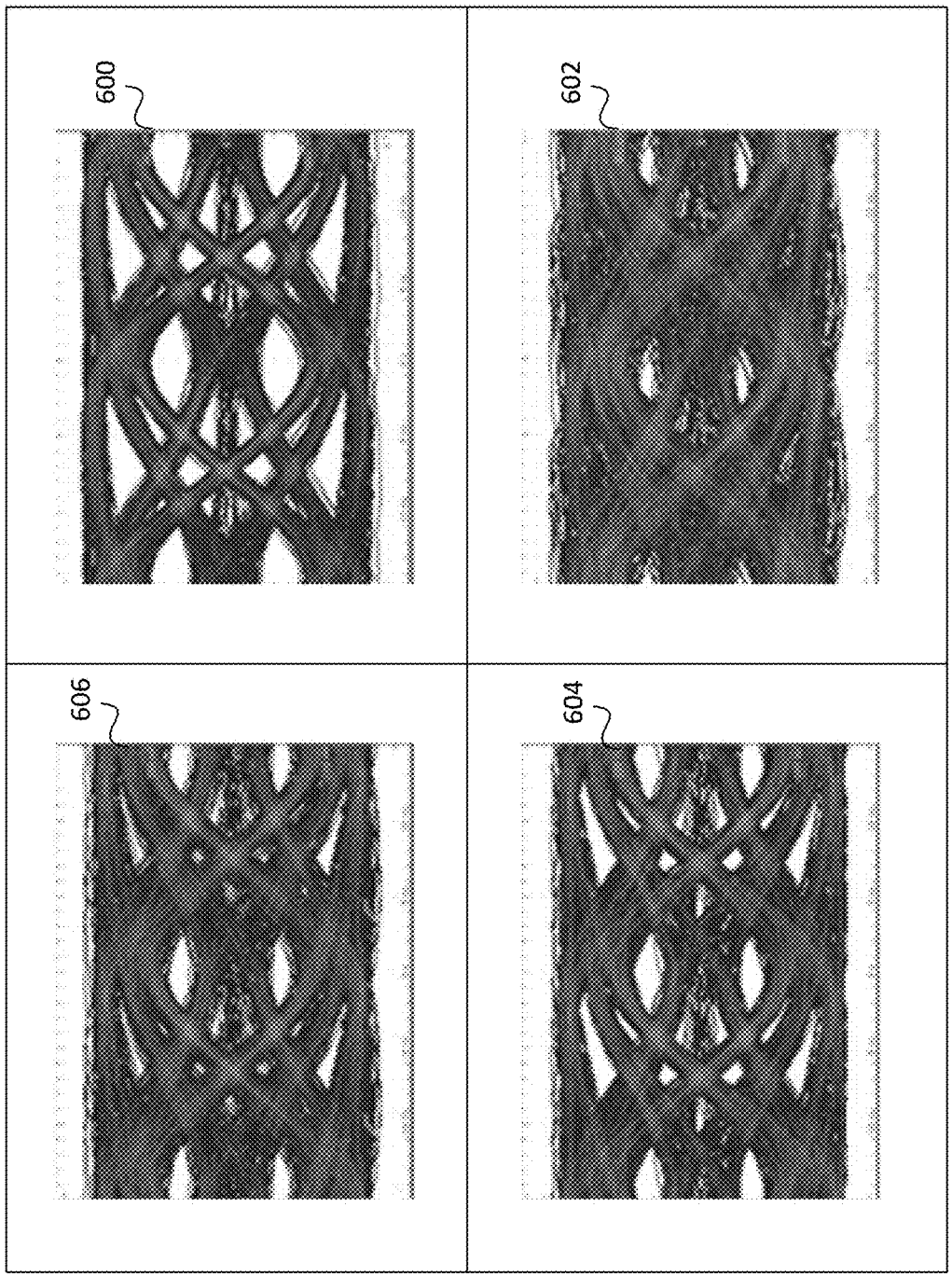
FIG. 6 includes example diagrams derived from signals extracted according to embodiments of the disclosure.

FIG. 6 illustrates eye diagrams that were generated by the test and measurement instrument 204 using the extracted waveforms illustrated in plots 504 and 506 of FIG. 5. Eye diagram 600 illustrates an eye diagram derived from an extracted Tx voltage signal, while diagram 602 illustrates an eye diagram derived from an extracted Rx voltage signal in which the phase difference due to parasitic reactance was not corrected. As can be seen in the eye diagram 602, the eye diagram 602 is distorted and the eye openings are relatively small because an optimized Rx signal was not extracted.

However, eye diagram 604 illustrates an extracted Rx voltage signal when the phase of the current waveform has been compensated. In eye diagram 604, the current waveform has a 3 nanosecond correction of the phase difference applied, compared with the uncompensated eye diagram 602. Eye diagram 606 illustrates an extracted Rx voltage signal when the phase of the current waveform has a 2 nanosecond correction of the phase difference applied, compared with the uncompensated eye diagram 602. When comparing eye diagram 604 and eye diagram 606, it is easy to see that the correction of 2 nanoseconds was not enough, as the eye openings of the eye diagram 606 are not as large.

Embodiments of the disclosure, as discussed above, allow for the signals from each of the devices to be extracted without having to interrupt the communication signal between the devices, which is required by conventional means for measuring the signals. This can result in more accurate results, as well as a simpler set up and operation for a user.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument for extracting waveforms from a differential transmission line, comprising a first input configured to receive a voltage waveform from a voltage probe electrically coupled to the differential transmission line that electrically connects a first device and a second device; a second input configured to receive a current waveform from a current probe coupled to the differential transmission line; and one or more processors configured to receive the voltage waveform and the current waveform and determine a voltage of the first device and a voltage of the second device based on the voltage waveform and the current waveform.

Example 2 is the test and measurement instrument of example 1, wherein the one or more processors are further configured to determine the voltage of the first device and the voltage of the second device based on an impedance of the differential transmission line.

Example 3 is the test and measurement instrument of either one of examples 1 and 2, wherein the one or more processors are further configured to determine the voltage of the first device using the following equation:

$$V_{Tx}=(V_{TxRx}+I_{TxRx}*Z)\div 2,$$

where $V_{Tx}$ is the voltage of the first device, $V_{TxRx}$ is the voltage waveform of the transmission line, $I_{TxRx}$ is the current waveform of the differential transmission line, and Z is an impedance of the differential transmission line.

Example 4 is the test and measurement instrument of any one of examples 1-3, wherein the one or more processors are further configured to determine the voltage of the first device using the following equation:

$$V_{Rx}=(V_{TxRx}-I_{TxRx}*Z)\div 2,$$

where $V_{Rx}$ is the voltage of the second device, $V_{TxRx}$ is the voltage waveform of the transmission line, $I_{TxRx}$ is the current waveform of the differential transmission line, and Z is an impedance of the differential transmission line.

Example 5 is the test and measurement instrument of any one of examples 1, 2, and 4, wherein the one or more processors are further configured to determine the voltage of the first device using the following equation:

$$V_{Tx}=(V_{TxRx}+I_{TxRx}*Z\div 2)\div 2,$$

where $V_{Tx}$ is the voltage of the first device, $V_{TxRx}$ is the voltage waveform of the transmission line, $I_{TxRx}$ is the current waveform of the differential transmission line, and Z is an impedance of the differential transmission line.

Example 6 is the test and measurement instrument of any one of examples 1, 2, 3, and 5, wherein the one or more processors are further configured to determine the voltage of the first device using the following equation:

$$V_{Rx}=(V_{TxRx}-I_{TxRx}*Z\div 2)\div 2,$$

where $V_{Rx}$ is the voltage of the second device, $V_{TxRx}$ is the voltage waveform of the transmission line, $I_{TxRx}$ is the current waveform of the differential transmission line, and Z is an impedance of the differential transmission line.

Example 7 is the test and measurement instrument of any one of examples 1-6, wherein the one or more processors are further configured to compensate a phase of one of the current waveform or the voltage waveform before determining the voltage of the second device.

Example 8 is the test and measurement instrument of any one of examples 1-7, wherein the differential transmission line is a full-duplex serial communication line.

Example 9 is a method for extracting a signal from a first device and a second device on a transmission line connecting a first device and a second device, comprising receiving a voltage waveform including the signal from the first device and the signal from the second device from a voltage probe electrically coupled to the transmission line; receiving a current waveform from a current probe coupled to the transmission line; and separating the signal of the first device and the signal of the second device from the voltage waveform based on the voltage waveform and the current waveform.

Example 10 is the method of example 9, wherein separating the signal of the first device and the signal of the second device from the voltage waveform includes separating the signal of the first device and the signal of the second device based on an impedance of the differential transmission line.

Example 11 is the method of either one of examples 9 or 10, wherein separating the signal of the first device includes using the following equation:

$$V_{Tx}=(V_{TxRx}+I_{TxRx}*Z)\div 2,$$

where $V_{Tx}$ is the signal of the first device, $V_{TxRx}$ is the voltage waveform, $I_{TxRx}$ is the current waveform, and Z is an impedance of the transmission line.

Example 12 is the method of any one of examples 9-11, wherein separating the signal of the second device includes using the following equation:

$$V_{Rx}=(V_{TxRx}-I_{TxRx}*Z)\div 2,$$

where $V_{Rx}$ is the signal of the first device, $V_{TxRx}$ is the voltage waveform, $I_{TxRx}$ is the current waveform, and Z is an impedance of the transmission line.

Example 13 is the method of any one of examples 9, 10, or 12, wherein separating the signal of the first device includes using the following equation:

$$V_{Tx}=(V_{TxRx}+I_{TxRx}*Z\div2)\div2,$$

where $V_{Tx}$ is the signal of the first device, $V_{TxRx}$ is the voltage waveform, $I_{TxRx}$ is the current waveform, and Z is an impedance of the transmission line.

Example 14 is the method of any one of examples 9-11 or 13, wherein separating the signal of the second device includes using the following equation:

$$V_{Rx}=(V_{TxRx}-I_{TxRx}*Z\div2)\div2,$$

where $V_{Rx}$ is the signal of the first device, $V_{TxRx}$ is the voltage waveform, $I_{TxRx}$ is the current waveform, and Z is an impedance of the transmission line.

Example 15 is the method of any of examples 9-14, further comprising compensating a phase of one of the current waveform or the voltage waveform before separating the signal of the second device.

Example 16 is the method of any one of examples 9-15, wherein the transmission line is a full-duplex serial communication line.

Example 17 is one or more computer-readable storage media comprising instructions, which, when executed by one or more processors of a test and measurement instrument, cause the test and measurement instrument to receive a voltage waveform including a signal from a first device and a signal from a second device from a voltage probe electrically coupled to a communication link between the first device and the second device; receive a current waveform from a current probe coupled to the communication link; separate the signal of the first device from the voltage waveform based on the voltage waveform and the current waveform; and separate the signal of the second device from the voltage waveform based on the voltage waveform and the current waveform.

Example 18 is the one or more computer-readable storage media of example 17, wherein separating the signal of the first device and the signal of the second device from the voltage waveform includes separating the signal of the first device and the signal of the second device based on an impedance of the differential transmission line.

Example 19 is the one or more computer-readable storage media of either one of examples 17 or 18, further comprising instructions configured to compensate a phase of one of the current waveform or the voltage waveform before separating the signal of the second device Example 20 is the one or more computer-readable storage media of any one of examples 17-19, wherein the communication link is a full-duplex serial communication link.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument for extracting waveforms from a differential transmission line that electrically connects a first device and a second device in concurrent signal communication, comprising:
a first input configured to receive a superimposed voltage waveform from a voltage probe electrically coupled to the differential transmission line;
a second input configured to receive a superimposed current waveform from a current probe coupled to the differential transmission line; and
one or more processors configured to receive the superimposed voltage waveform and the superimposed current waveform and determine a voltage of the first device and a voltage of the second device based on the superimposed voltage waveform, the superimposed current waveform, and an impedance of the differential transmission line;
wherein the one or more processors determine the voltage of the first device by subtracting the voltage of the second device from the superimposed voltage waveform, and determine the voltage of the second device by subtracting the voltage of the first device from the superimposed voltage waveform.

2. The test and measurement instrument of claim 1, wherein the one or more processors are further configured to receive the impedance of the differential transmission line through a user input or from a memory.

3. The test and measurement instrument of claim 1, wherein the one or more processors are further configured to determine the voltage of the first device using the following equation:

$$V_{Tx}=(V_{TxRx}+I_{TxRx}*Z)\div2,$$

where $V_{Tx}$ is the voltage of the first device, $V_{TxRx}$ is the superimposed voltage waveform of the differential transmission line, $I_{TxRx}$ is the superimposed current waveform of the differential transmission line, and Z is the impedance of the differential transmission line.

4. The test and measurement instrument of claim 1, wherein the one or more processors are further configured to determine the voltage of the second device using the following equation:

$$V_{Rx}=(V_{TxRx}-I_{TxRx}*Z)\div2,$$

where $V_{Rx}$ is the voltage of the second device, $V_{TxRx}$ is the superimposed voltage waveform of the differential transmission line, $I_{TxRx}$ is the superimposed current waveform of the differential transmission line, and Z is the impedance of the differential transmission line.

5. The test and measurement instrument of claim 1, wherein the one or more processors are further configured to determine the voltage of the first device using the following equation:

$$V_{Tx}=(V_{TxRx}+I_{TxRx}*Z\div2)\div2,$$

where $V_{Tx}$ is the voltage of the first device, $V_{TxRx}$ is the superimposed voltage waveform of the differential transmission line, $I_{TxRx}$ is the superimposed current waveform of the differential transmission line, and Z is the impedance of the differential transmission line.

6. The test and measurement instrument of claim 1, wherein the one or more processors are further configured to determine the voltage of the second device using the following equation:

$$V_{Rx}=(V_{TxRx}-I_{TxRx}*Z\div2)\div2,$$

where $V_{Rx}$ is the voltage of the second device, $V_{TxRx}$ is the superimposed voltage waveform of the differential transmission line, $I_{TxRx}$ is the superimposed current waveform of the differential transmission line, and Z is the impedance of the differential transmission line.

7. The test and measurement instrument of claim 1, wherein the one or more processors are further configured to compensate a phase of one of the superimposed current waveform or the superimposed voltage waveform before determining the voltage of the second device.

8. The test and measurement instrument of claim 1, wherein the differential transmission line is a full-duplex serial communication link.

9. A method for extracting a signal of a first device and a signal of a second device concurrently transmitted on a transmission line connecting the first device and the second device, the method comprising:
receiving a superimposed voltage waveform including the signal of the first device and the signal of the second device from a voltage probe electrically coupled to the transmission line;
receiving a superimposed current waveform including the signal of the first device and the signal of the second device from a current probe coupled to the transmission line; and
separating the signal of the first device and the signal of the second device from the superimposed voltage waveform based on the superimposed voltage waveform, the superimposed current waveform, and an impedance of the transmission line;
wherein separating the signal of the first device includes subtracting the signal of the second device from the superimposed voltage waveform, and separating the signal of the second device includes subtracting the signal of the first device from the superimposed voltage waveform.

10. The method of claim 9, further comprising receiving the impedance of the transmission line through a user input or from a memory.

11. The method of claim 9, wherein separating the signal of the first device includes using the following equation:

$$V_{Tx}=(V_{TxRx}+I_{TxRx}*Z)\div2,$$

where $V_{Tx}$ is the signal of the first device, $V_{TxRx}$ is the superimposed voltage waveform, $I_{TxRx}$ is the superimposed current waveform, and Z is the impedance of the transmission line.

12. The method of claim 9, wherein separating the signal of the second device includes using the following equation:

$$V_{Rx}=(V_{TxRx}-I_{TxRx}*Z)\div2,$$

where $V_{Rx}$ is the signal of the second device, $V_{TxRx}$ is the superimposed voltage waveform, $I_{TxRx}$ is the superimposed current waveform, and Z is the impedance of the transmission line.

13. The method of claim 9, wherein separating the signal of the first device includes using the following equation:

$$V_{Tx}=(V_{TxRx}+I_{TxRx}*Z\div2)\div2,$$

where $V_{Tx}$ is the signal of the first device, $V_{TxRx}$ is the superimposed voltage waveform, $I_{TxRx}$ is the superimposed current waveform, and Z is the impedance of the transmission line.

14. The method of claim 9, wherein separating the signal of the second device includes using the following equation:

$$V_{Rx}=(V_{TxRx}-I_{TxRx}*Z\div2)\div2,$$

where $V_{Rx}$ is the signal of the second device, $V_{TxRx}$ is the superimposed voltage waveform, $I_{TxRx}$ is the superimposed current waveform, and Z is the impedance of the transmission line.

15. The method of claim 9, further comprising compensating a phase of one of the superimposed current waveform or the superimposed voltage waveform before separating the signal of the second device.

16. The method of claim 9, wherein the transmission line is a full-duplex serial communication link.

17. One or more non-transitory computer-readable storage media comprising instructions, which, when executed by one or more processors of a test and measurement instrument, cause the test and measurement instrument to:
receive a superimposed voltage waveform including a signal from a first device and a signal from a second device from a voltage probe electrically coupled to a communication link between the first device and the second device;
receive a superimposed current waveform from a current probe electrically coupled to the communication link;
separate the signal from the first device from the superimposed voltage waveform based on the superimposed voltage waveform, the superimposed current waveform, and an impedance of the communication link, by subtracting the signal from the second device from the superimposed voltage waveform; and
separate the signal from the second device from the superimposed voltage waveform based on the superimposed voltage waveform, the superimposed current waveform, and the impedance of the communication link, by subtracting the signal from the first device from the superimposed voltage waveform.

18. The one or more non-transitory computer-readable storage media of claim 17, further comprising instructions that cause the test and measurement instrument to receive the impedance of the communication link from a user input or from a memory.

19. The one or more non-transitory computer-readable storage media of claim 17, further comprising instructions configured to compensate a phase of one of the superimposed current waveform or the superimposed voltage waveform before separating the signal from the second device.

20. The one or more non-transitory computer-readable storage media of claim 17, wherein the communication link is a full-duplex serial communication link.

21. The test and measurement instrument of claim 1,
wherein the differential transmission line comprises a positive side and a negative side; and
wherein the current probe comprises a differential current probe coupled to the positive side and to the negative side.

22. The test and measurement instrument of claim 1, further comprising a third input;

wherein the differential transmission line comprises a positive side and a negative side; and wherein the current probe comprises a first current probe coupled between the positive side and the second input, and a second current probe coupled between the negative side and the third input.

23. The method of claim 9, wherein the transmission line comprises a first side and a second side, and wherein the current probe comprises a differential current probe coupled to the first side and to the second side.

24. The method of claim 9, wherein the transmission line comprises a first side and a second side, and wherein receiving the superimposed current waveform comprises receiving the superimposed current waveform from a first current probe coupled to the first side and a second current probe coupled to the second side.

* * * * *